(12) United States Patent
Sun

(10) Patent No.: US 9,035,708 B2
(45) Date of Patent: May 19, 2015

(54) LOW NOISE VOLTAGE CONTROLLED OSCILLATOR

(71) Applicant: International Business Machines Corporation, Armonk, NY (US)

(72) Inventor: Pinping Sun, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 13/916,612

(22) Filed: Jun. 13, 2013

(65) Prior Publication Data

US 2014/0368286 A1 Dec. 18, 2014

(51) Int. Cl.
*H03B 5/24* (2006.01)
*H03B 5/12* (2006.01)

(52) U.S. Cl.
CPC ........................................ *H03B 5/24* (2013.01)

(58) Field of Classification Search
USPC ......................................... 331/117 R, 117 FE
See application file for complete search history.

(56) References Cited

U.S. PATENT DOCUMENTS

| | | | |
|---|---|---|---|
| 7,414,481 B2 | 8/2008 | Li et al. | |
| 7,755,442 B2 | 7/2010 | Li et al. | |
| 7,924,110 B2 * | 4/2011 | McCorquodale et al. | .... 331/179 |
| 8,031,020 B1 * | 10/2011 | Tu et al. | ................... 331/117 FE |
| 8,493,155 B2 * | 7/2013 | Razafimandimby | ........ 331/36 C |
| 8,665,030 B2 * | 3/2014 | Lu et al. | ................... 331/117 FE |
| 2012/0249250 A1 * | 10/2012 | Cheng et al. | ..................... 331/45 |

OTHER PUBLICATIONS

Chiou, H.K. et al., "Low Phase Noise Ku-Band Gm-Boosting Differential Colpitts VCO" IEEE Microwave Conference (Dec. 7-10, 2009) pp. 313-316.
Li, X. et al., "Gm-Boosted Common-Gate LNA and Differential Colpitts VCO/QVCO in 0.18-um CMOS" iEEE Journal of Solid-State Circuts (Dec. 2005) pp. 2609-2619, vol. 40, No. 12.
Koukab, A., "LC-VCO Design With Dual-Gm, Boosted for RF Oscillation and Attenuated for LF Noise" IEEE Microwave and Wireless Components Letters (Dec. 2010) pp. 675-677, vol. 20, No. 12.

* cited by examiner

*Primary Examiner* — Joseph Chang
(74) *Attorney, Agent, or Firm* — Scully, Scott, Murphy & Presser, P.C.; H. Daniel Schnurmann

(57) ABSTRACT

An enhanced negative resistance voltage controlled oscillator (VCO) circuit is provided, in which a parallel connection of a capacitor and a resistor configured to provide frequency-dependent transconductance is present across source nodes of a first pair of field effect transistors in which gate nodes and drain nodes are cross-coupled. The source nodes of the first pair of field effect transistors are electrically shorted to drain nodes of a second pair of field effect transistors of which the gate nodes are electrically shorted to the gate nodes of the first pair of field effect transistors. The parallel connection of the capacitor and the resistor includes a parallel connection of a capacitor and a resistor such that the net transconductance of the first pair of field effect transistors is less at low frequencies where thermal noise and flicker noise are dominant part of the phase noise than at the operational frequency range.

19 Claims, 4 Drawing Sheets

LOW NOISE VOLTAGE CONTROLLED OSCILLATOR

BACKGROUND

The present disclosure relates to a semiconductor circuit, and particularly to a voltage controlled oscillator circuit for low power applications.

The rapid growth of wireless communication systems such as global system for mobile communications (GSM), CDMA (code division multiple access), WCDMA (wideband code division multiple access), and 802.11a/b/g has driven the proliferation of high performance functional blocks to be integrated into low cost complementary metal oxide semiconductor (CMOS) devices. In multi-gigahertz range wireless communication, the communication bandwidth is heavily dependent on the quality of the signal source or frequency synthesizer that includes a voltage controlled oscillator (VCO).

The ever increasing requirement for the bandwidth places very stringent requirements on the design of a VCO in terms of frequency, power consumption, and noise level. At the same time, the next generation of communication chips will be integrated into a low cost deep submicron process. This means that the supply voltage for a VCO needs to be reduced with the ongoing scaling of CMOS devices. Thus, the next generation data signal modulator (DSM) design is expected to provide a reduced power supply voltage without phase noise degradation.

While conventional VCO designs are preferred for simplicity, the conventional VCO designs have the disadvantage of not providing reduction of transconductance ($g_m$) of the circuit at low frequencies, thereby providing significant thermal noise and flicker noise. Further, the conventional VCO designs do not provide any enhancement of the transconductance $g_m$ at the oscillation frequency, and thus, the oscillation amplitude is limited. As a result, the conventional VCO designs do not provide improvement in the phase noise or reduction in the power consumption.

SUMMARY

An enhanced negative resistance voltage controlled oscillator (VCO) circuit is provided, in which a parallel connection of a capacitor and a resistor configured to provide frequency-dependent transconductance is present across source nodes of a first pair of field effect transistors in which gate nodes and drain nodes are cross-coupled. The source nodes are electrically shorted to drain nodes of a second pair of field effect transistors of which the gate nodes are electrically shorted to the gate nodes of the first pair of field effect transistors. The parallel connection of the capacitor and the resistor includes a parallel connection of a capacitor and a resistor connected with the source nodes of the first pair of field effect transistors such that the net transconductance of the first pair of field effect transistors is less at low frequencies where thermal noise and flicker noise are dominant part of the phase noise than at frequencies about the operational frequency range. The parallel connection of the capacitor and the resistor reduces the phase noise and power consumption of the VCO circuit.

According to an aspect of the present disclosure, a voltage controlled oscillator (VCO) circuit is provided. The voltage controlled oscillator (VCO) circuit includes a first transistor and a second transistor configured such that a gate of the first transistor is electrically shorted to a drain of the second transistor, and a gate of the second transistor is electrically shorted to a drain of the first transistor. The VCO circuit further includes a parallel connection of a capacitor and a resistor providing frequency-dependent transconductance and connected across a source of the first transistor and a source of the second transistor.

DETAILED DESCRIPTION

Figure 1:
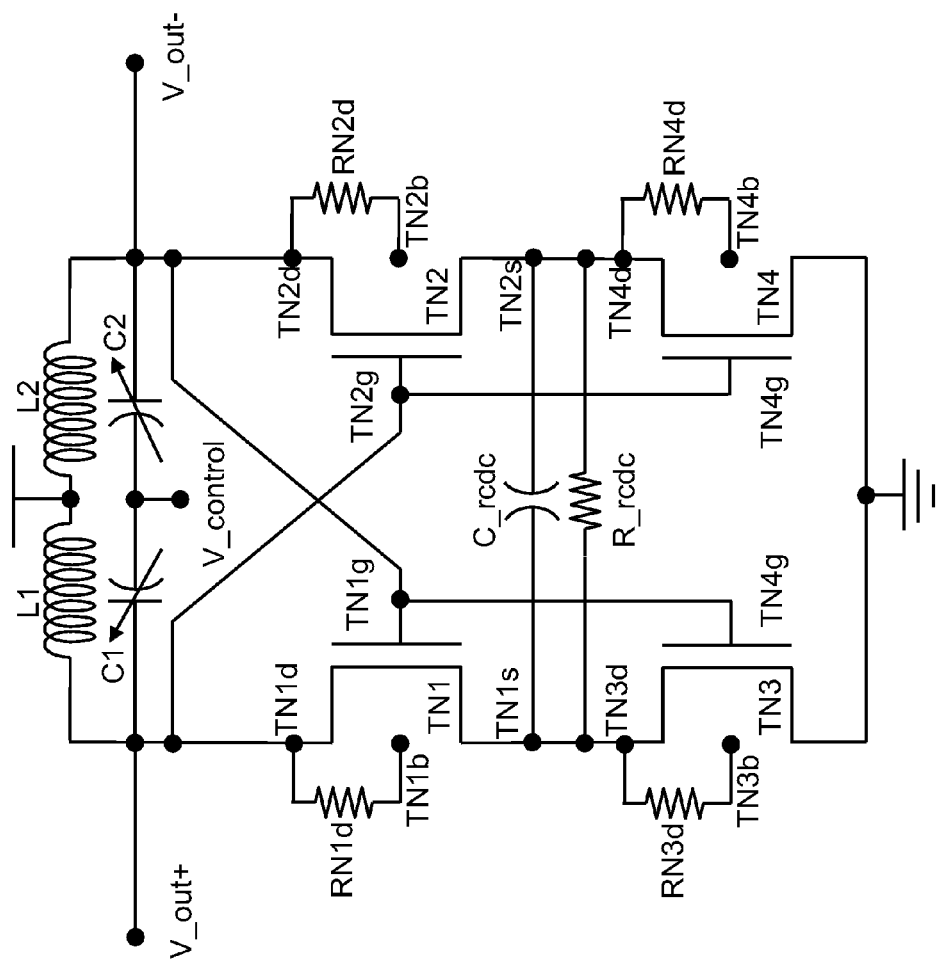
FIG. 1 is a circuit schematic of an exemplary voltage controlled oscillator (VCO) circuit employing n-type field effect transistors according to an embodiment of the present disclosure.

As stated above, the present disclosure relates to a voltage controlled oscillator circuit for low phase noise applications. Aspects of the present disclosure are now described in detail with accompanying figures. Like and corresponding elements mentioned herein and illustrated in the drawings are referred to by like reference numerals. The drawings are not necessarily drawn to scale. As used herein, ordinals such as "first" and "second" are employed merely to distinguish similar elements, and different ordinals may be employed to designate a same element in the specification and/or claims.

As used herein, a "circuit" refers to a set of devices that provides at least one current path between a power supply device and electrical ground. As used herein, a "voltage controlled oscillator" or a "VCO" refers to an electronic oscillator designed to be controlled in oscillation frequency by a voltage input.

Referring to FIG. 1, an exemplary voltage controlled oscillator (VCO) circuit according to an embodiment of the present disclosure is illustrated in a circuit schematic. The exemplary VCO circuit includes a pair of cross-coupled transistors including a first transistor TN1 and a second transistor TN2 that are located on a substrate. The substrate is a physical structure in which physical devices corresponding to the various circuit elements in the exemplary VCO circuit are physically implemented. The substrate can be a semiconductor substrate, and the various circuit elements can be implemented as semiconductor devices manufactured on the semiconductor substrate and/or metallic or semiconductor structures embedded within metal interconnect structures formed upon the semiconductor substrate.

A first gate TN1g of the first transistor TN1 is electrically shorted to a second drain TN2d of the second transistor TN2. A second gate TN2g of the second transistor TN2 is electrically shorted to a first drain TN1d of the first transistor TN1. As used herein, a first element is electrically shorted to a second element if the only resistance between the first element and the second element is a parasitic resistance and the first element and the second element have a substantially same voltage in all states of the operation of the circuit. As used herein, voltages are substantially the same if the difference in the voltages is less 1% of the difference between the most positive power supply voltage of the circuit and the most negative power supply voltage of the circuit (which can be 0 V if the most negative power supply voltage is the voltage of electrical ground), and is less than 0.1 V in all states of the operation of the circuit. In other words, the voltages are substantially the same if the difference in the voltages is less than the lesser of two quantities, the first quantity being 0.1 V and the second quantity being 1% of the difference between the most positive power supply voltage of the circuit and the most negative power supply voltage of the circuit in all states of the operation of the circuit. The parasitic resistance is typically less than 5 Ohms, and can be less than 1 Ohm. A plurality of electrically shorted nodes constitutes a single node in a circuit schematic.

A parallel connection of a capacitor and a resistor is provided across the source nodes of the pair of cross-coupled transistors, i.e., across a first source TN1s of the first transistor TN1 and a second source TN2s of the second transistor TN2. The parallel connection is a resistor-capacitor degenerated cross-coupled pair. As used herein, a "cross-coupled pair" refers to a pair of two electrical components that provides an interconnection between a node of a first set of components and another node of a second set of components. As used herein, a "resistor-capacitor degenerated" cross-coupled pair refers to a cross-coupled pair that includes a parallel connection of a resistor and a capacitor and provides a time constant that is the product of the resistance of the resistor and the capacitance of the capacitor to the rest of the circuit. The parallel connection of the capacitor and the resistor includes a parallel connection of a capacitor C_rcdc and a resistor R_rcdc across source nodes of the pair of cross-coupled transistors, and provides a frequency-dependent transconductance.

The exemplary VCO circuit can further include a second pair of cross-coupled transistors. The second pair of cross-coupled transistors can include a third transistor TN3 and a fourth transistor TN4 that are located on the substrate. A third drain TN3d of the third transistor TN3 is electrically shorted to a first source TN1s of the first transistor TN1, and a fourth drain TN4d of the fourth transistor TN4 is electrically shorted to a second source TN2s of the second transistor TN2. A third source TN3s of the third transistor TN3 and a fourth source TN4s of the fourth transistor TN4 are connected to a common node.

A third gate TN3g of the third transistor TN3 is electrically shorted to the first gate TN1g of the first transistor TN1. A fourth gate TN4 of the fourth transistor TN4 is electrically shorted to the second gate TN2g of the second transistor TN2. The third transistor TN3 and the fourth transistor TN4 collectively provide current switching during the operation of the exemplary VCO circuit at the operating frequency of the exemplary VCO circuit.

The exemplary VCO circuit can further include at least one inductor, which can be a differential inductor electrically shorted to the first drain TN1d of the first transistor TN1 at one end and electrically shorted to the second drain TN2d of the second transistor TN2 at another end. In one embodiment, the at least one inductor can include a series connection of a first inductor L1 and a second inductor L2. In one embodiment, the node between the first inductor L1 and the second inductor L2 can be a power supply node, which is herein referred to as a first power supply node. One end of the at least one inductor can be electrically shorted to the first drain TN1d of the first transistor TN1, and another end of the at least one inductor can be electrically shorted to the second drain TN2d of the second transistor TN2.

In one embodiment, the common node at which the third source TN3s of the third transistor TN3 is electrically connected to the fourth source TN4s of the fourth transistor TN4 can be another power supply node, which is herein referred to as a second power supply node.

The exemplary VCO circuit can further include a series connection of a first capacitor C1 and a second capacitor C2. The first capacitor C1 and the second capacitor C2 are capacitors that are distinct from, i.e., not identical to, the capacitor C_rcdc within the parallel connection of the capacitor and the resistor. In one embodiment, one end of the series connection of the first and second capacitors (C1, C2) is electrically shorted to the first drain TN1d of the first transistor TN1, and another end of the series connection of the first and second capacitors (C1, C2) is electrically shorted to the second drain TN2d of the second transistor TN2.

In one embodiment, a voltage control circuit electrically shorted to a node between the first capacitor and the second capacitor and configured to provide a control voltage that alters an operating frequency of the VCO circuit. The control voltage can change the operating frequency of the VCO circuit from a nominal operating frequency of the VCO circuit.

In one embodiment, both of the first capacitor C1 and the second capacitor C2 can be a varactor, i.e., a capacitor that has a tunable, i.e., variable, capacitance. In this case, change of the capacitance of varactors across the first drain TN1d of the first transistor TN1 and the second drain TN2d of the second transistor TN2 can change the operating frequency of the VCO circuit.

A first output voltage can be provided at a first output node V_out+, which is the same as the node of the first drain TN1d. A second output voltage can be provided at a second output node V_out−, which is the same as the node of the second drain TN2d. Thus, the first drain TN1d of the first transistor TN1 is electrically shorted to the first output node V_out+ of the exemplary VCO circuit, and the second drain TN2d of the second transistor TN2 is electrically shorted to the second output node V_out− of the exemplary VCO circuit.

In one embodiment, the combination of the first output node V_out+ and the second output node V_out− can be employed to provide the output voltage of the exemplary VCO circuit. In other words, the output voltage of the exemplary VCO circuit can be provided across the first output node V_out+ and the second output node V_out−, which can be output voltage nodes.

In one embodiment, the first transistor TN1, the second transistor TN2, the third transistor TN3, and the fourth transistor TN4 can be n-type field effect transistors. In this case, the first power supply node can supply a first voltage, the second power supply node can supply a second voltage, and the first voltage can be more positive than the second voltage. The difference between the first voltage and the second voltage can be in a range from 0.3 V to 2 V, although lesser and greater differences can also be employed. In one embodiment, the second power supply node can be electrical ground. In this case, the second voltage can be 0 V.

Figure 2:
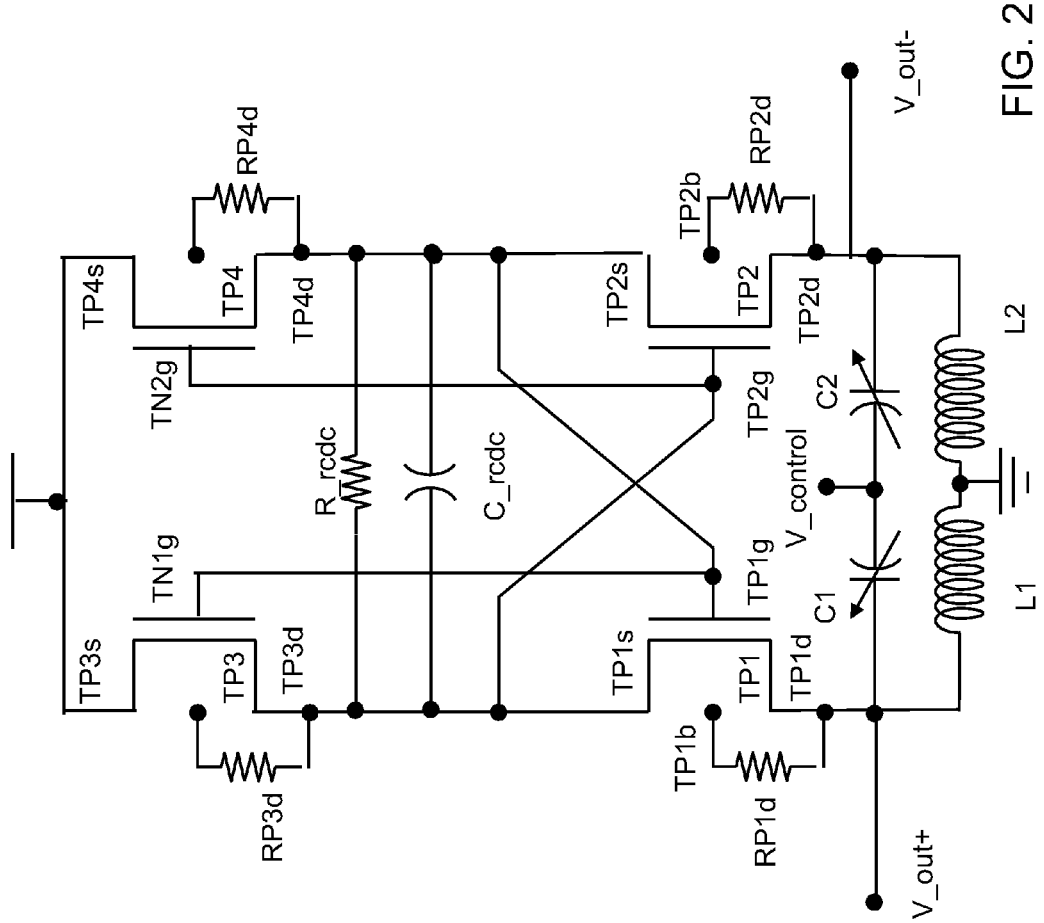
FIG. 2 is a circuit schematic of an exemplary voltage controlled oscillator (VCO) circuit employing p-type field effect transistors according to an embodiment of the present disclosure.

In another embodiment shown in FIG. 2, the first transistor TN1, the second transistor TN2, the third transistor TN3, and the fourth transistor TN4 can replaced with p-type field effect transistors that include a first transistor TP1, a second transistor TP2, a third transistor TP3, and a fourth transistor TP4, respectively. Further, various components in the circuit of FIG. 1 can be replaced with corresponding components shown in FIG. 2 and labeled with names in which the letter "N" is replaced with the letter "P." In this case, the first power supply node can supply a first voltage, the second power supply node can supply a second voltage, and the first voltage can be more negative than the second voltage. The magnitude of the difference between the first voltage and the second voltage can be in a range from 0.35 V to 2 V, although lesser and greater magnitudes of the difference can also be employed. In one embodiment, the second power supply node can be electrical ground. In this case, the second voltage can be 0 V.

The operational characteristics of each transistor TNi, in which i is an integer selected from 1, 2, 3, and 4) can be characterized by a transconductance $g_i$ of the transistor TNi. The transconductance $g_i$ of the transistor TNi is defined by:

$$g_i = \frac{\partial I_{Di}}{\partial V_{GSi}}$$

in which $I_{Di}$ is the source-to-drain current of the transistor TNi, $V_{GSi}$ is the gate-to-source bias voltage of the transistor TNi. In one embodiment, the transconductance of the first transistor TN1 and the transconductance of the second transistor TN2 can be substantially matched. As used herein, the transconductance of a first transistor and the transconductance of a second transistor are "substantially matched" if the transconductances of the first and second transistors do not deviate from the average transconductance of the first and second transistors by more than 10% of the average transconductance. In one embodiment, the transconductance of the first transistor TN1 and the transconductance of the second transistor TN2 do not deviate from the average transconductance of the first and second transistors (TN1, TN2) by more than 1% of the average transconductance.

In an idealized case in which the transconductance of the first transistor TN1 is the same as the transconductance of the second transistor TN2, i.e., $g_1=g_2$, the transconductance $G_m$ of the circuit including the cross-coupled pair of first and second transistors (TN1, TN2) and the parallel connection of the capacitor and the resistor is given by:

$$G_m = \frac{g_1(j2\pi fRC + 1)}{j2\pi fRC + 1 + g_1R/2},$$

in which f is the operating frequency of the VCO circuit (i.e., the switching frequency of the VCO circuit), R is the resistance of the resistor R_rcdc in the parallel connection of the capacitor and the resistor, and C is the capacitance of the capacitor C_rcdc in the parallel connection of the capacitor and the resistor.

Thus, the transconductance $G_m$ of the circuit including the cross-coupled pair of first and second transistors (TN1, TN2) and the parallel connection of the capacitor and the resistor is frequency dependent. The transconductance $G_m$ approaches a low frequency limit value $G_{m\_LF}$ given by:

$$G_{m\_LF} = \frac{g_1}{1 + g_1R/2}$$

when the operating frequency is significantly less than ½πRC. Further, the transconductance $G_m$ approaches a high frequency limit value $G_{m\_HF}$ given by: $G_{m\_HF}=g_1$ when the operating frequency is greater than $$\frac{1 + g_1R}{2\pi RC}$$

In one embodiment, the inductance of the first inductor L1 can be substantially matched to the inductance of the second inductor L2. As used herein, the inductance of a first inductor and the inductance of a second inductor are "substantially matched" if the inductances of the first and second inductors do not deviate from the average inductance of the first and second inductors by more than 10% of the average inductance. Further, the capacitance of the first capacitor C1 can be substantially matched to the capacitance of the second capacitor C2. As used herein, the capacitance of a first capacitor and the capacitance of a second capacitor are "substantially matched" if the capacitances of the first and second capacitors do not deviate from the average capacitance of the first and second capacitors by more than 10% of the average capacitance.

The nominal operating frequency $f_0$ of the exemplary VCO circuit is in a range from 0.9 times $1/(2\pi\sqrt{L'C'})$ and 1.1 times $1/(2\pi\sqrt{L'C'})$, in which L' is the average inductance of the first and second inductors, and C' is the average capacitance of the first and second capacitors. If the inductance of the first inductor is L' and the inductance of the second inductor is L' and the capacitance of the first capacitor is C' and the capacitance of the second capacitor is C', the nominal operating frequency $f_0$ of the exemplary VCO circuit can be $1/(2\pi\sqrt{L'C'})$.

The transconductance of the first transistor TN1 can be substantially matched to the transconductance of the second transistor TN2, and the transconductance of the third transistor TN3 can be substantially matched to the transconductance of the fourth transistor TN4.

In the exemplary VCO circuit, a first resistor RN1d can be electrically shorted to the first drain TN1d at one end, and can be electrically shorted to the body of the first transistor TN1 (which is herein referred to as a first body TN1b) at another end. A second resistor RN2d can be electrically shorted to the second drain TN2d at one end, and can be electrically shorted to the body of the second transistor TN2 (which is herein referred to as a second body TN2b) at another end. In one embodiment, the resistance of the first resistor RN1d can be substantially matched with the resistance of the second resistor RN2d. As used herein, the resistance of a first resistor and the resistance of a second resistor are "substantially matched" if the resistances of the first and second resistors do not deviate from the average resistance of the first and second resisitors (RN1d, RN2d) by more than 10% of the average resistance. The matching of the resistance of the first resistor RN1d with the resistance of the second resistor RN2d can provide enhanced performance of the exemplary VCO by enhancing operational symmetry of the exemplary VCO circuit.

Further, a third resistor RN3d can be electrically shorted to the third drain TN3d at one end, and can be electrically shorted to the body of the third transistor TN3 (which is herein referred to as a third body TN3b) at another end. A fourth resistor RN4d can be electrically shorted to the fourth drain TN4d at one end, and can be electrically shorted to a body of the fourth transistor TN4 (which is herein referred to as a fourth body TN4b) at another end. In one embodiment, the resistance of the third resistor RN3d can be substantially matched with the resistance of the fourth resistor RN4d. As used herein, the resistance of a third resistor and the resistance of a fourth resistor are "substantially matched" if the resistances of the third and fourth resistors do not deviate from the average resistance of the third and fourth resistors (RN3d, RN4d) by more than 10% of the average resistance. The matching of the resistance of the third resistor RN3d with the resistance of the fourth resistor RN4d can provide enhanced performance of the exemplary VCO by enhancing operational symmetry of the exemplary VCO circuit.

Forward biased body voltages provided through the first resistor RN1d, the second resistor RN2d, the third resistor RN3d, and the fourth resistor RN4d can reduce the threshold voltage of the first transistor TN1, the second transistor TN2, the third transistor TN3 and the fourth transistor TN4, and thus, reduce the difference between the first and second power supply voltages applied across the first power supply node and the second power supply node.

By selecting the values of R and C such that $g_1R$ is smaller 2×(2π$f_0$RC−1) in which $f_0$ is a nominal operating frequency of the exemplary VCO circuit, the variable transconductance $G_m$ can reduce the flicker noise and the thermal noise of the exemplary VCO circuit. This phenomenon holds true even if $g_1$ is not the same as $g_2$ as long as $g_1$ is substantially matched to $g_2$.

The parallel connection of the capacitor and the resistor effectively modifies the transconductances of the first and second transistors (TN1, TN2), but does not modify the transconductance of the third and fourth transistors (TN3, TN4). Thus, the presence of the third and fourth transistors (TN3, TN4) has the effect of increasing the negative resistance of the cross-coupled pair of the first and second transistors (TN1, TN2) without increasing the current consumption. Within the exemplary VCO circuit, the phenomenon of the device surface capture and release of charge carriers is reduced. As a result, the current source flicker noise derived from the current sources, i.e., the third and fourth transistors (TN3, TN4), is also reduced.

Thus, the exemplary VCO circuit reduces the flicker noise for the four transistors (TN1, TN2, TN3, TN4) and reduces the thermal noise for the first and second transistors (TN1, TN2). Further, the addition of the pair of the third and fourth transistors (TN3, TN4) to the cross-coupled pair of first and second transistors (TN1, TN2) causes an effective increase in the negative resistance from a value about $-2/g_1$ (or about $-2/g_2$) to another value about $-2/(g_1+g_3)$ (or about $-2/(g_2+g_4)$). The increase in the negative resistance increases the oscillation amplitude for the output voltages provided across the first and second output nodes (V_out+, V_out−).

The exemplary VCO circuit enables a low power and low phase noise operation. Compared with VCO circuits that does not have a parallel connection of the capacitor and the resistor, the presence of the parallel connection of the capacitor and the resistor in the exemplary VCO circuit can reduce the thermal noise and flicker noise of cross-coupled pair of the first and second transistors (TN1, TN2), thus enabling a significant phase noise improvement at low offset frequencies, while still being capable to keeping the effective transconductance of the exemplary VCO circuit at the operating frequency range (i.e., at the oscillation frequency range) to provide an oscillation output signal with an optimized phase noise. Further, the pair of third and fourth transistors (TN3, TN4) provides reduction of the flicker noise of the current source. The various matched resistors (RNd1, RNd2, RNd3, RNd4) eliminate the need for any additional voltage biasing circuits, while preserving the symmetry of the operation in the exemplary VCO circuit.

Figure 3:
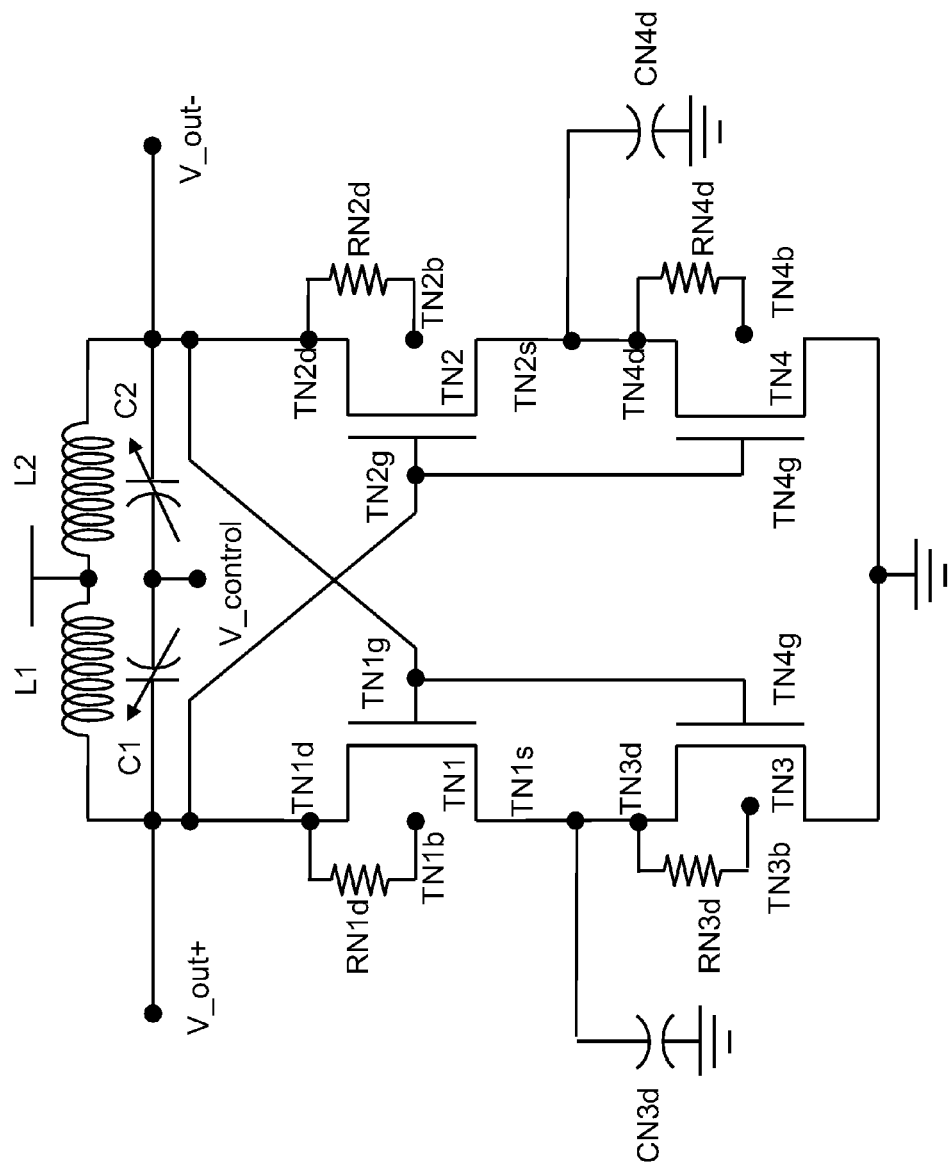
FIG. 3 is a comparative exemplary VCO circuit that does not employ a parallel connection of a capacitor and a resistor.

Referring to FIG. 3, a comparative exemplary VCO circuit that does not employ a parallel connection of the capacitor and the resistor is illustrated. The comparative exemplary VCO circuit is illustrated to illuminate the effect of the parallel connection of the capacitor and the resistor in the exemplary VCO circuit of FIG. 1. The comparative exemplary VCO circuit can be derived from the exemplary VCO circuit by eliminating the degenerated resistor R_rcdc. Optionally, the degenerated capacitor C_rcdc may be replaced with a first high frequency decoupling capacitor CN3d and a second high frequency decoupling capacitor CN4d. The capacitance of the third and fourth capacitors (CN3d, CN4d) can be optimized to control the transconductance of the third and fourth transistors (TN3, TN4).

A comparison of performance parameters of the exemplary VCO circuit relative to corresponding performance parameters for the comparative exemplary VCO circuits is shown in Table 1.

TABLE 1

Performance parameter comparison among the exemplary VCO circuit and thecomparative exemplary VCO circuit.

|  | The exemplary VCO circuit of FIG. 1 | The comparative exemplary VCO circuit of FIG. 3 |
| --- | --- | --- |
| Channel length (nm) | 32 | 32 |
| Nominal oscillation frequency $f_0$ (GHz) | 26.52 | 26.46 |
| Power Supply Voltage (V) | 0.35 | 0.35 |
| Current Consumption (mA) | 1.773 | 1.773 |
| Phase Noise@ Δf = 1 MHz (dbc/Hz) | −91.6 | −89.3 |
| Phase Noise@ Δf = 10 MHz (dbc/Hz) | −114.6 | −108 |
| Figure of merit (FOM) | 182.1 | 179.8 |

In Table 1, the figure of merit (FOM) is defined by:

$$FOM = 10\log\left(\left(\frac{f_0}{\Delta f}\right)^2 \frac{1}{P[\text{mW}]}\right) - L\{\Delta f\}$$

in which $f_0$ is the nominal oscillation frequency, Δf is the frequency offset to nominal oscillation frequency $f_0$, L{Δf} is the phase noise when the frequency offset is at Δf MHz, and P[mW] is the power consumption in units of mW.

As evidenced in Table 1, the exemplary VCO circuit generates less phase noise over a wide range of the frequency offset Δf, while consuming a comparable level of power with respect to the comparative exemplary VCO circuit. Thus, the exemplary VCO circuit has a greater figure of merit than the comparative exemplary VCO circuit. The exemplary VCO circuit and the comparative exemplary VCO circuit provide greater figures of merit with respect to other VCO circuits known in the art.

Figure 4:
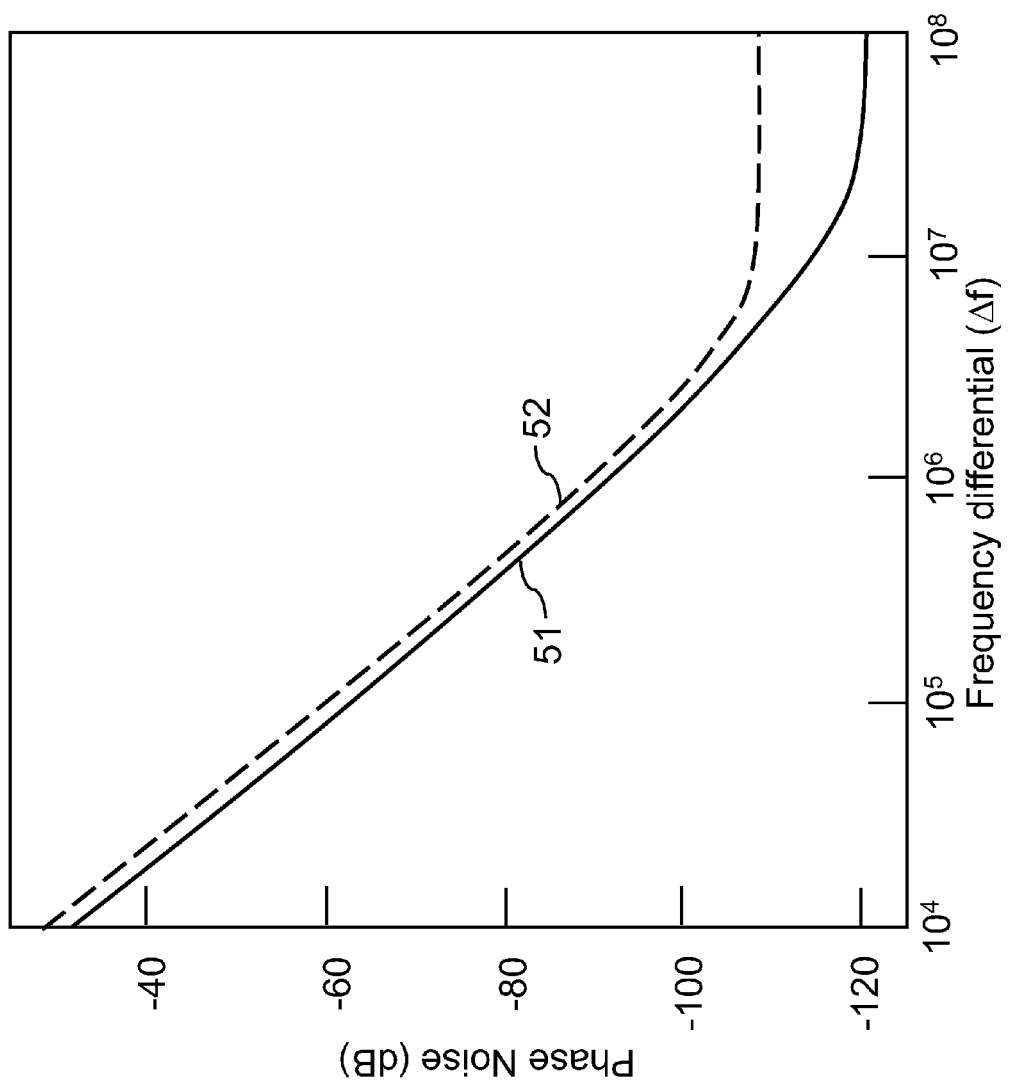
FIG. 4 is a graph representing the phase noise as a function of a frequency offset $\Delta f$ from the oscillation frequency $f_0$ for the exemplary VCO circuit of FIG. 1 and for the comparative exemplary VCO circuit of FIG. 3.

Referring to FIG. 4, a first curve 51 represents the phase noise as a function of a frequency offset Δf to the nominal oscillation frequency $f_0$ for the exemplary VCO circuit of FIG. 1. A second curve 52 represents the phase noise as a function of a frequency offset Δf to the nominal oscillation frequency $f_0$ for the comparative exemplary VCO circuit of FIG. 3. The first and second curves (51, 52) demonstrate that the exemplary VCO circuit of FIG. 1 including the parallel connection of the capacitor and the resistor provides a lower phase noise relative to the comparative exemplary VCO circuit of FIG. 3 that does not include any parallel connection of the capacitor and the resistor.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A voltage controlled oscillator (VCO) circuit comprising:
   a first transistor and a second transistor, wherein a gate of said first transistor is electrically shorted to a drain of said second transistor, and a gate of said second transistor is electrically shorted to a drain of said first transistor;
   at least one inductor electrically shorted to said drain of said first transistor at one end and electrically shorted to said drain of said second field transistor at another end; and
   a parallel connection of a capacitor and a resistor providing frequency-dependent transconductance and connected across a source of said first transistor and a source of said second transistor.

2. The VCO circuit of claim 1, wherein $g_1R$ is less than $2\times(2\pi f_0 RC-1)$ and $g_2R$ is less than $2\times(2\pi f_0 RC-1)$, wherein $g_1$ is a transconductance of said first transistor, $g_2$ is a transconductance of said second transistor, R is a resistance of a resistor in said parallel connection of said capacitor and said resistor, C is a capacitance of a capacitor in said parallel connection of said capacitor and said resistor and $f_0$ is said nominal operating frequency of said VCO circuit.

3. The VCO circuit of claim 1, wherein said at least one inductor includes a series connection of a first inductor and a second inductor.

4. The VCO circuit of claim 3, wherein a node between said first inductor and said second inductor is a power supply node.

5. The VCO circuit of claim 3, further comprising a series connection of a first capacitor and a second capacitor, wherein one end of said series connection of said first and second capacitors is electrically shorted to said drain of said first transistor and another end of said series connection of said first and second capacitors is electrically shorted to said drain of said second transistor.

6. The VCO circuit of claim 5, wherein a nominal operating frequency of said VCO circuit is in a range from 0.9 times $1/(2\pi f_0 RC-1)$ and 1.1 times $1/(2\pi\sqrt{L'C'})$, wherein an average inductance of said first and second inductors is L', an average capacitance of said first and second capacitors is C'.

7. The VCO circuit of claim 6, wherein $g_1R$ is less than $2\times(2\pi f_0 RC-1)$ and $g_2R$ is less than $2\times(2\pi f_0 RC-1)$, wherein $g_1$ is a transconductance of said first transistor, $g_2$ is a transconductance of said second transistor, R is a resistance of a resistor in said parallel connection of said capacitor and said resistor, C is a capacitance of a capacitor in said parallel connection of said capacitor and said resistor and $f_0$ is said nominal operating frequency of said VCO circuit.

8. The VCO circuit of claim 5, wherein a voltage control circuit electrically shorted to a node between said first capacitor and said second capacitor and configured to provide a control voltage that alters an operating frequency of said VCO circuit.

9. The VCO circuit of claim 5, wherein both of said first capacitor and said second capacitor are capacitors or varactors.

10. The VCO circuit of claim 1, wherein said first transistor and said second transistor are n-type field effect transistors.

11. The VCO circuit of claim 1, wherein said drain of said first transistor is electrically shorted to a first output node of said VCO circuit, and said drain of said second transistor is electrically shorted to a second output node of said VCO circuit.

12. The VCO circuit of claim 1, further comprising a third transistor and a fourth transistor, wherein a drain of said third transistor is electrically shorted to said source of said first transistor, a drain of said fourth transistor is electrically shorted to said source of said second transistor, and a source of said third transistor and a source of said fourth transistor are connected to a common node.

13. The VCO circuit of claim 12, wherein a gate of said third transistor is electrically shorted to said gate of said first transistor, and a gate of said fourth transistor is electrically shorted to said gate of said second transistor.

14. The VCO circuit of claim 13, wherein all of said first transistor, said second transistor, said third transistor, and said fourth transistor are either n-type field effect transistors or p-type field effect transistors.

15. The VCO circuit of claim 14, wherein a transconductance of said first transistor is substantially matched to a transconductance of said second transistor, and a transconductance of said third transistor is substantially matched to a transconductance of said fourth transistor.

16. The VCO circuit of claim 12, further comprising:
    a resistor electrically shorted to said drain of said third transistor at one end and electrically shorted to a body of said third transistor at another end; and
    another resistor electrically shorted to said drain of said fourth transistor at one end and electrically shorted to a body of said fourth transistor at another end.

17. A voltage controlled oscillator (VCO) circuit comprising:
    a first transistor and a second transistor, wherein a gate of said first transistor is electrically shorted to a drain of said second transistor, and a gate of said second transistor is electrically shorted to a drain of said first transistor;
    a first resistor electrically shorted to said drain of said first transistor at one end and electrically shorted to a body of said first transistor at another end;
    a second resistor electrically shorted to said drain of said second transistor at one end and electrically shorted to a body of said second transistor at another end; and
    a parallel connection of a capacitor and another resistor providing frequency-dependent transconductance and connected across a source of said first transistor and a source of said second transistor.

18. The VCO circuit of claim 17, wherein a resistance of said first resistor is substantially matched with a resistance of said second resistor.

19. A voltage controlled oscillator (VCO) circuit comprising:
    a first transistor and a second transistor, wherein a gate of said first transistor is electrically shorted to a drain of said second transistor, and a gate of said second transistor is electrically shorted to a drain of said first transistor;
    a parallel connection of a capacitor and a resistor providing frequency-dependent transconductance and connected across a source of said first transistor and a source of said second transistor; and
    a third transistor and a fourth transistor, wherein a drain of said third transistor is electrically shorted to said source of said first transistor, a drain of said fourth transistor is electrically shorted to said source of said second transistor, and a source of said third transistor and a source of said fourth transistor are connected to a common node.

* * * * *